United States Patent
Jang et al.

(10) Patent No.: US 6,245,691 B1
(45) Date of Patent: *Jun. 12, 2001

(54) OZONE-TEOS METHOD FOR FORMING WITH ATTENUATED SURFACE SENSITIVITY A SILICON OXIDE DIELECTRIC LAYER UPON A THERMALLY OXIDIZED SILICON SUBSTRATE LAYER

(75) Inventors: Syun-Ming Jang; Chen-Hua Yu, both of Hsin-Chu (TW)

(73) Assignee: Taiwan Semiconductor Manufacturing Company, Hsin-chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 09/086,770

(22) Filed: May 29, 1998

(51) Int. Cl.$^7$ .................................................. H01L 21/31
(52) U.S. Cl. ........................ 438/787; 438/624; 438/424; 438/439
(58) Field of Search .................... 438/424, 439, 438/624, 787

(56) References Cited

U.S. PATENT DOCUMENTS

| | | | |
|---|---|---|---|
| 5,229,316 | * 7/1993 | Lee et al. | 438/424 |
| 5,712,185 | * 1/1998 | Tsai et al. | 438/424 |
| 5,731,241 | * 3/1998 | Jang et al. | 438/424 |
| 5,814,377 | * 9/1998 | Robles et al. | 427/579 |
| 5,817,566 | * 10/1998 | Jang et al. | 438/424 |

\* cited by examiner

Primary Examiner—Michael Trinh
Assistant Examiner—Maria Guerrero
(74) Attorney, Agent, or Firm—George O. Saile; Stephen B. Ackerman; Alek P. Szecsy

(57) ABSTRACT

A method for forming a silicon oxide dielectric layer within a microelectronics fabrication. There is first provided a silicon substrate layer employed within a microelectronics fabrication. There is then formed employing the silicon substrate a thermal silicon oxide layer through thermal oxidation of the silicon substrate layer. There is then formed upon the thermal silicon oxide layer a second silicon oxide layer formed through use of a thermal chemical vapor deposition (CVD) method employing ozone as an oxidant and tetraethylorthosilicate (TEOS) as a silicon source material. The thermal chemical vapor deposition (CVD) method also employs a reactor chamber pressure of from about 40 to about 80 torr. The second silicon oxide layer is formed with an attenuated surface sensitivity of the second silicon oxide layer with respect to the thermal silicon oxide layer. The method is particularly desirable when forming trench isolation regions within isolation trenches within silicon semiconductor substrates employed within integrated circuit microelectronics fabrications.

8 Claims, 2 Drawing Sheets

OZONE-TEOS METHOD FOR FORMING WITH ATTENUATED SURFACE SENSITIVITY A SILICON OXIDE DIELECTRIC LAYER UPON A THERMALLY OXIDIZED SILICON SUBSTRATE LAYER

BACKGROUND OF THE INVENTION

1. Field of the Invention

The present invention relates generally to ozone-TEOS thermal chemical vapor deposition (CVD) methods for forming within microelectronics fabrications silicon oxide dielectric layers. More particularly, the present invention relates to ozone-TEOS thermal chemical vapor deposition (CVD) methods for forming within microelectronics fabrications silicon oxide dielectric layers formed with attenuated surface sensitivity with respect to thermally oxidized silicon substrate layers.

2. Description of the Related Art

Integrated circuit microelectronics fabrications are formed from semiconductor substrates within and upon which are formed integrated circuit devices. The integrated circuit devices are connected internally and externally to the semiconductor substrates upon which they are formed through patterned integrated circuit conductor layers which are separated by integrated circuit dielectric layers.

As integrated circuit microelectronics fabrication integration levels have increased and integrated circuit device and patterned conductor layer dimensions have decreased, it has become more prevalent in the art of integrated circuit microelectronics fabrication to employ trench isolation methods, such as but not limited to shallow trench isolation (STI) methods and recessed oxide isolation (ROI) methods, to form trench isolation regions within a semiconductor substrate in order to separate the active regions of the semiconductor substrate within and upon which are formed integrated circuit devices.

Such shallow trench isolation (STI) methods and recessed oxide isolation (ROI) methods are desirable within integrated circuit microelectronics fabrications since shallow trench isolation (STI) methods and recessed oxide isolation (ROI) methods provide trench isolation regions which are nominally co-planar with a surface of an adjoining active region of a semiconductor substrate. Such nominally co-planar trench isolation regions and adjoining active regions of a semiconductor substrate generally optimize an attenuated depth of focus typically achievable with an advanced photoexposure apparatus employed when forming advanced integrated circuit microelectronics devices and advanced patterned conductor layers within an advanced integrated circuit microelectronics fabrication.

While shallow trench isolation (STI) methods and recessed oxide isolation (ROI) methods are thus desirable when forming trench isolation regions within advanced integrated circuit microelectronics fabrications, shallow trench isolation (STI) methods and recessed oxide isolation (ROI) methods are nonetheless not entirely without problems within advanced integrated circuit microelectronics fabrications. In particular, it is often difficult to form when employing shallow trench isolation (STI) methods within integrated circuit microelectronics fabrications shallow trench isolation regions which simultaneously possess superior gap filling properties, superior bulk physical properties and enhanced deposition rates which in the aggregate provide shallow trench isolation regions with optimal properties within advanced integrated circuit microelectronics fabrications.

Of the dielectric layer deposition methods potentially applicable for forming shallow trench isolation regions when employing shallow trench isolation (STI) methods within integrated circuit microelectronics fabrications, atmospheric pressure thermal chemical vapor deposition (APCVD) methods and sub-atmospheric pressure thermal chemical vapor deposition (SACVD) methods employing ozone as an oxidant source material and tetraethylorthosilicate (TEOS) as a silicon source material (hereinafter, in general, "ozone-TEOS thermal chemical vapor deposition (CVD) methods") are particularly desirable due to the superior gap filling properties of shallow trench isolation regions formed employing those ozone-TEOS thermal chemical vapor deposition (CVD) methods. Such ozone-TEOS thermal chemical vapor deposition (CVD) methods typically preclude plasma activation due to the increased reactor chamber pressures at which they are undertaken. While ozone-TEOS thermal chemical vapor deposition (CVD) methods do typically provide shallow trench isolation regions formed with superior gap filling properties, ozone-TEOS thermal chemical vapor deposition (CVD) methods typically nonetheless also provide shallow trench isolation regions with inferior bulk properties (as typically evidenced by increased aqueous hydrofluoric acid etch rate) and with attenuated deposition rates upon thermal silicon oxide trench liner layers formed through thermal oxidation of silicon semiconductor substrates within which are formed those shallow trench isolation regions employing those ozone-TEOS thermal chemical vapor deposition (CVD) methods.

It is thus towards the goal of forming within integrated circuit microelectronics fabrications shallow trench isolation regions while employing ozone-TEOS thermal chemical vapor deposition (CVD) methods to provide shallow trench isolation regions simultaneously possessing: (1) enhanced gap filling properties; (2) enhanced bulk properties, such as but not limited to aqueous hydrofluoric acid wet chemical etch rate; and (3) attenuated surface sensitivity of the shallow trench isolation regions when formed upon thermal silicon oxide trench liner layers formed through thermal oxidation of silicon semiconductor substrates, that the present invention is more specifically directed. In a more general sense, the present invention is directed towards forming within microelectronics fabrications which are not necessarily integrated circuit microelectronics fabrications silicon oxide dielectric layers formed employing ozone-TEOS thermal chemical vapor deposition (CVD) methods, where the silicon oxide dielectric layers simultaneously possess: (1) enhanced gap filling properties: (2) enhanced bulk properties; and (3) attenuated surface sensitivity of the silicon oxide dielectric layers with respect to other microelectronics substrate layers which may include, but are not limited to, thermal silicon oxide dielectric layers formed through thermal oxidation of a silicon substrate layer.

Various aspects of ozone-TEOS thermal chemical vapor deposition (CVD) methods for forming silicon oxide dielectric layers within microelectronics fabrications have been disclosed in the arts of microelectronics fabrication.

For example, Chang et al., in ULSI Technology, McGraw-Hill (1997), pp. 415–419 discloses in general various aspects of ozone-TEOS atmospheric pressure thermal chemical vapor deposition (APCVD) methods and ozone-TEOS sub-atmospheric pressure thermal chemical vapor deposition (SACVD) methods for forming silicon oxide dielectric layers within integrated circuit microelectronics fabrications.

In addition, Kwok et al., in U.S. Pat. No. 5,271,972, discloses a method for attenuating a surface sensitivity of a first silicon oxide dielectric layer formed through either: (1) an ozone-TEOS atmospheric pressure thermal chemical vapor deposition (APCVD) method; or (2) an ozone-TEOS sub-atmospheric pressure thermal chemical vapor deposition (SACVD) method, when the first silicon oxide dielectric layer is formed upon a second silicon oxide dielectric layer formed employing a plasma enhanced chemical vapor deposition (PECVD) method. The method employs a sequential ramping down of a plasma power during the last few seconds of forming the second silicon oxide dielectric layer while employing the plasma enhanced chemical vapor deposition (PECVD) method, to thereby form an interstitial silicon oxide layer upon the surface of the second silicon oxide dielectric layer, where the interstitial silicon oxide layer provides the second silicon oxide dielectric layer with attenuated surface sensitivity for forming upon the second silicon oxide dielectric layer the first silicon oxide dielectric layer.

Similarly with Kwok et al., Nguyen et al., in U.S. Pat. No. 5,356,722, also discloses a method for attenuating a surface sensitivity of a first silicon oxide dielectric layer formed employing an ozone-TEOS sub-atmospheric pressure thermal chemical vapor deposition (SACVD) method, when the first silicon oxide dielectric layer is formed upon a second silicon oxide dielectric layer formed employing a plasma enhanced chemical vapor deposition (PECVD) method. The method employs incorporating a nitrogen containing gas, such as nitrogen, ammonia or a nitrogen oxide, as a reactant gas within a reactant gas composition employed in forming the second silicon oxide dielectric layer.

Yet similarly, Wang et al., in U.S. Pat. No. 5,362,526, discloses an ozone-TEOS thermal chemical vapor deposition (CVD) method for forming a silicon oxide dielectric layer within an integrated circuit microelectronics fabrication. The method employs a substrate temperature of from about 200 to about 500 degrees centigrade and a reactor chamber pressure of from about 10 to about 200 torr to form the silicon oxide dielectric layer with enhanced bulk properties.

Further, Chen, in U.S. Pat. No. 5,489,553, discloses a method for enhancing gap filling and step coverage properties of a first silicon oxide dielectric layer formed employing an ozone-TEOS atmospheric pressure thermal chemical vapor deposition (APCVD) method or an ozone-TEOS sub-atmospheric pressure thermal chemical vapor deposition (SACVD) method, when the first silicon oxide dielectric layer is formed upon a patterned conductor layer within an integrated circuit microelectronics fabrication. The method employs forming upon the patterned conductor layer within the integrated circuit microelectronics fabrication a second silicon oxide dielectric layer and subsequently treating the second silicon oxide dielectric layer with hydrofluoric acid vapor to form a fluorinated second silicon oxide dielectric layer which enhances gap filling and step coverage properties of the first silicon oxide dielectric layer when formed upon the second silicon oxide dielectric layer.

Yet further, Jang et al., in U.S. Pat. No. 5,563,104, discloses a method for attenuating pattern sensitivity when forming over patterned conductor layers within integrated circuit microelectronics fabrications silicon oxide dielectric layers formed employing ozone-TEOS sub-atmospheric pressure thermal chemical vapor deposition (SACVD) methods. The method employs forming over a patterned conductor layer within an integrated circuit microelectronics fabrication a bilayer silicon oxide dielectric layer formed employing the ozone-TEOS sub-atmospheric pressure thermal chemical vapor deposition (SACVD) method where the first layer within the bilayer silicon oxide dielectric layer is formed at a comparatively lower deposition temperature which attenuates the pattern sensitivity of the bilayer silicon oxide dielectric layer and the second layer within the bilayer silicon oxide dielectric layer is formed at a comparatively higher temperature which enhances the bulk properties of the bilayer silicon oxide dielectric layer.

Still yet further, Ikeda, in U.S. Pat. No. 5,593,741, discloses a method for forming upon a patterned substrate layer within an integrated circuit microelectronics fabrication a silicon oxide dielectric layer with enhanced gap filling and step coverage properties. The method may employ an ozone containing oxidant source material along with a tetraethylorthosilicate (TEOS) silicon source material, where the ozone containing oxidant source material and the tetraethylorthosilicate (TEOS) silicon source material are employed within a reactor chamber within which there is cyclically increased and decreased the density of a plasma containing oxygen ions to form when at a minimum plasma density a silicon oxide dielectric layer with enhanced gap filling and step coverage properties which when subsequently treated with the plasma at a maximum plasma density provides the silicon oxide dielectric layer with enhanced bulk properties.

Finally, Jang et al., in U.S. Pat. No. 5,726,090, discloses an ozone-TEOS thermal chemical vapor deposition (CVD) method for forming upon a thermal silicon oxide trench liner layer within an isolation trench within a silicon substrate employed within an integrated circuit microelectronics fabrication an ozone-TEOS thermal chemical vapor deposited (CVD) silicon oxide dielectric layer. The method employs forming upon the thermal silicon oxide trench liner layer a nitrogen plasma treated plasma enhanced chemical vapor deposited (PECVD) silicon oxide trench liner layer formed employing silane as a silicon source material prior to forming the ozone-TEOS thermal chemical vapor deposited (CVD) silicon oxide layer thereupon.

Desirable in the art of microelectronics fabrication are additional methods and materials through which there may be formed within microelectronics fabrications silicon oxide dielectric layers employing ozone/TEOS thermal chemical vapor deposition (CVD) methods to provide silicon oxide dielectric layers possessing: (1) enhanced gap filling properties; (2) enhanced bulk properties; and (3) attenuated surface sensitivity with respect to thermally oxidized silicon substrate layers upon which are formed those silicon oxide dielectric layers. It is towards the foregoing goals that the present invention is more generally directed.

SUMMARY OF THE INVENTION

A first object of the present invention is to provide a method for forming within a microelectronics fabrication a silicon oxide dielectric layer.

A second object of the present invention is to provide a method in accord with the first object of the present invention, where the silicon oxide dielectric layer is formed employing an ozone-TEOS thermal chemical vapor deposition (CVD) method while forming the silicon oxide dielectric layer with enhanced gap filling properties, enhanced bulk properties and an attenuated surface sensitivity with respect to a thermally oxidized silicon substrate layer upon which is formed the silicon oxide dielectric layer.

A third object of the present invention is to provide a method in accord with the first object of the present invention or the second object of the present invention, which method is readily commercially implemented.

In accord with the objects of the present invention, there is provided by the present invention a method for forming a silicon oxide dielectric layer within a microelectronics fabrication. To practice the method of the present invention, there is first provided a silicon substrate layer employed within a microelectronics fabrication. There is then formed employing the silicon substrate layer a thermal silicon oxide dielectric layer through thermal oxidation of the silicon substrate layer. Finally, there is then formed upon the thermal silicon oxide dielectric layer a second silicon oxide dielectric layer formed employing a thermal chemical vapor deposition (CVD) method which employs ozone as an oxidant and tetraethylorthosilicate (TEOS) as a silicon source material. The thermal chemical vapor deposition (CVD) method also employs a reactor chamber pressure of from about 40 to about 80 torr, to form with an attenuated surface sensitivity with respect to the thermal silicon oxide dielectric layer the second silicon oxide dielectric layer upon the thermal silicon oxide dielectric layer.

The present invention provides a method for forming within a microelectronics fabrication a silicon oxide dielectric layer, where the silicon oxide dielectric layer is formed employing an ozone-TEOS thermal chemical vapor deposition (CVD) method while forming the silicon oxide dielectric layer with enhanced gap filling properties, enhanced bulk properties and attenuated surface sensitivity with respect to a thermally oxidized silicon substrate layer upon which is formed the silicon oxide dielectric layer. The method of the present invention realizes the foregoing objects by employing within the ozone-TEOS thermal chemical vapor deposition (CVD) method through which is formed the silicon oxide dielectric layer a reactor chamber pressure of from about 40 to about 80 torr. While the mechanism through which the method of the present invention provides a silicon oxide dielectric layer formed employing an ozone-TEOS thermal chemical vapor deposition (CVD) with enhanced gap filling properties, enhanced bulk properties and an attenuated surface sensitivity when formed upon a thermally oxidized silicon substrate layer when employing a reactor chamber pressure of from about 40 to about 80 torr is not entirely clear, it is nonetheless clear that the foregoing reactor chamber pressure range provides a silicon oxide dielectric layer formed employing an ozone-TEOS thermal chemical vapor deposition (CVD) method with enhanced gap filling properties, enhanced bulk properties and attenuated surface sensitivity when formed upon a thermally oxidized silicon substrate layer in comparison with an otherwise equivalent silicon oxide dielectric layer formed employing a reactor chamber pressure of from about 400 to about 760 torr, as is more conventionally employed within the art of microelectronics fabrication.

The method of the present invention is readily commercially implemented. The method of the present invention forms a silicon oxide dielectric layer employing an ozone-TEOS thermal chemical vapor deposition (CVD) method which is generally known in the art of microelectronics fabrication. Since it is control of the parameters within the method of the present invention which provides at least in part the present invention, rather than existence of the method of the present invention which provides the present invention, the method of the present invention is readily commercially implemented.

BRIEF DESCRIPTION OF THE DRAWINGS

The objects, features and advantages of the present invention are understood within the context of the Description of the Preferred Embodiments, as set forth below. The Description of the Preferred Embodiments is understood within the context of the accompanying drawings, which form a material part of this disclosure, wherein.

DESCRIPTION OF THE PREFERRED EMBODIMENTS

The present invention provides a method for forming a silicon oxide dielectric layer within a microelectronics fabrication through use of an ozone-TEOS thermal chemical vapor deposition (CVD) method, where the silicon oxide dielectric layer so formed is formed with enhanced gap filling properties, enhanced bulk properties and attenuated surface sensitivity when forming the silicon oxide dielectric layer upon a thermally oxidized silicon substrate layer. The method of the present invention realizes the foregoing objects by employing within the ozone-TEOS thermal chemical vapor deposition (CVD) method a reactor chamber pressure of from about 40 to about 80 torr. While the mechanism through which the method of the present invention provides a silicon oxide dielectric layer formed employing an ozone-TEOS thermal chemical vapor deposition (CVD) method with enhanced gap filling properties, enhanced bulk properties and attenuated surface sensitivity with respect to a thermally oxidized silicon substrate layer is not entirely clear, it is nonetheless clear the method of the present invention provides a silicon oxide dielectric layer with enhanced gap filing properties, enhanced bulk properties and attenuated surface sensitivity with respect to a thermally oxidized silicon substrate layer upon which is formed the silicon oxide dielectric layer, in comparison with silicon oxide dielectric layers formed employing ozone-TEOS thermal chemical vapor deposition (CVD) methods as are conventional in the art of microelectronics fabrication, which conventional methods typically employ reactor chamber pressures of from about 400 to about 760 torr.

Although the method of the present invention is most likely to provide value when forming within silicon semiconductor substrates shallow trench isolation regions within shallow trenches separating active regions of a semiconductor substrate, the method of the present invention may also be employed when forming silicon oxide dielectric layers employing ozone-TEOS thermal chemical vapor deposition (CVD) methods upon thermally oxidized silicon substrate layers within microelectronics fabrications including but not limited to integrated circuit microelectronics fabrications, solar cell microelectronics fabrications, ceramic substrate microelectronics fabrications and flat panel display microelectronics fabrications.

First Preferred Embodiment

Figure 1:
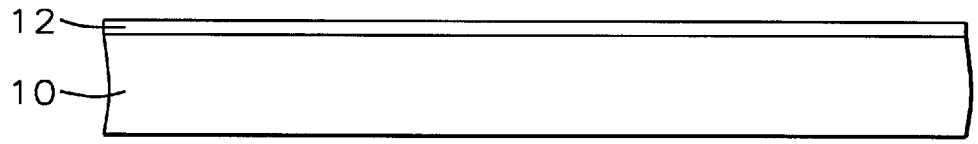
FIG. 1 and FIG. 2 show a pair of schematic cross-sectional diagrams illustrating the results of forming within a microelectronics fabrication in accord with a general embodiment of the present invention which comprises a first preferred embodiment of the present invention a silicon oxide dielectric layer employing an ozone-TEOS thermal chemical vapor deposition (CVD) method in accord with the method of the present invention.
Figure 2:
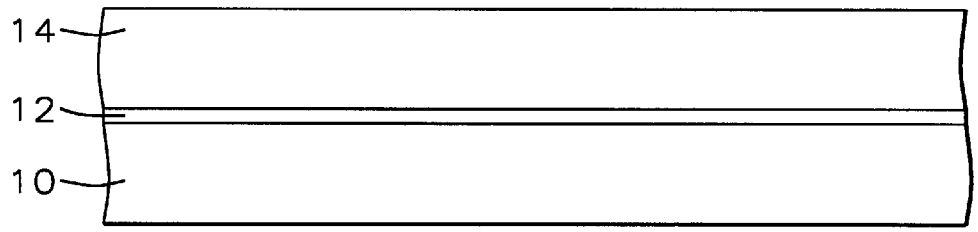

Referring now to FIG. 1 and FIG. 2, there is shown a pair of schematic cross-sectional diagrams illustrating the results of progressive stages in forming within a microelectronics fabrication in accord with a general embodiment of the present invention which comprises a first preferred embodiment of the present invention a silicon oxide dielectric layer employing an ozone-TEOS thermal chemical vapor deposition (CVD) method in accord with the method of the present invention. Shown in FIG. 1 is a schematic cross-sectional diagram of the microelectronics fabrication at an early stage in practice of the method of the present invention.

Shown in FIG. 1 is a substrate 10 employed within a microelectronics fabrication, where the substrate 10 has formed thereover a thermal silicon oxide dielectric layer 12. Within the first preferred embodiment of the present invention, the substrate may be a substrate employed within a microelectronics fabrication selected from the group including but not limited to integrated circuit microelectronics fabrications, solar cell microelectronics fabrications, ceramic substrate microelectronics fabrications and flat panel display microelectronics fabrications. Although not specifically illustrated within the schematic cross-sectional diagram of FIG. 1, the substrate 10 may be the substrate itself employed within the microelectronics fabrication, or in the alternative, the substrate may be the substrate employed within the microelectronics fabrication, where the substrate has formed thereupon or thereover any of several additional microelectronics layers as are conventionally employed within the microelectronics fabrication. Such additional microelectronics layers may include, but are not limited to, microelectronics conductor layers, microelectronics semiconductor layers and microelectronics dielectric layers.

With respect to the thermal silicon oxide dielectric layer 12 formed upon the substrate 10 within the microelectronics fabrication whose schematic cross-sectional diagram is illustrated in FIG. 1, the thermal silicon oxide dielectric layer 12 is formed through thermal oxidation of a silicon substrate layer. The silicon substrate layer may be the substrate 10, when the substrate 10 is a silicon substrate. In the alternative, the silicon substrate layer may be an independent silicon substrate layer formed over the substrate 10 when the substrate 10 is formed of a material other than a silicon material.

Preferably, the thermal silicon oxide dielectric layer 12, independent of the source silicon substrate layer employed in forming the thermal silicon oxide dielectric layer 12, is formed employing a thermal oxidation method employing a temperature of from about 850 to about 1000 degrees centigrade for a time period of at least about 20 minutes (preferably from about 20 to about 40 minutes) to form the thermal silicon oxide dielectric layer 12 of thickness at least about 150 angstroms (preferably from about 150 to about 350 angstroms) over the substrate 10.

Referring now to FIG. 2, there is shown a schematic cross-sectional diagram illustrating the results of further processing of the microelectronics fabrication whose schematic cross-sectional diagram is illustrated in FIG. 1. Shown in FIG. 2 is a schematic cross-sectional diagram of a microelectronics fabrication otherwise equivalent to the microelectronics fabrication whose schematic cross-sectional diagram is illustrated in FIG. 1, but wherein there is formed upon the thermal silicon oxide dielectric layer 12 a second silicon oxide dielectric layer 14.

Within the first preferred embodiment of the present invention, the second silicon oxide dielectric layer 14 is formed employing an ozone-TEOS thermal chemical vapor deposition (CVD) method at a reactor chamber pressure of from about 40 to about 80 torr, without plasma activation.

Preferably, the ozone-TEOS thermal chemical vapor deposition (CVD) method also employs: (1) a substrate 10 temperature of from about 460 to about 500 degrees centigrade; (2) a tetraethylorthosilicate (TEOS) concentration of from about 300 to about 600 milligrams per cubic meter in a helium or nitrogen carrier gas flow of from about 3000 to about 5000 standard cubic centimeters per minute (sccm); and (3) an ozone concentration of from about 10 to about 15 weight percent in an oxygen carrier gas flow of from about 4000 to about 6000 standard cubic centimeters per minute (sccm).

As is shown within the examples which follow, a silicon oxide dielectric layer formed employing an ozone-TEOS thermal chemical vapor deposition (CVD) method in accord with the method of the present invention exhibits: (1) enhanced gap filling properties; (2) enhanced bulk properties; and (3) an attenuated surface sensitivity with respect to a thermal silicon oxide substrate layer, such as the thermal silicon oxide dielectric layer 12, in comparison with silicon oxide dielectric layers formed employing ozone-TEOS thermal chemical vapor deposition (CVD) methods conventional in the art of microelectronics fabrication which typically employ a reactor chamber pressure of from about 400 to about 760 torr and a substrate temperature of from bout 350 to about 500 degrees centigrade.

Within the first preferred embodiment of the present invention, it is believed that the generally decreased reactor chamber pressure within the ozone-TEOS thermal chemical vapor deposition (CVD) method of the present invention provides primarily the attenuated surface sensitivity of silicon oxide dielectric layers formed employing the method of the present invention upon thermally oxidized silicon substrate layers, while secondarily contributing synergistically with increased substrate temperatures to improved bulk properties (such as gap-filling properties) of the silicon oxide dielectric layers formed employing the method of the present invention. Similarly, the generally increased substrate temperatures employed when forming silicon oxide dielectric layers employing the ozone-TEOS thermal chemical vapor deposition (CVD) method of the present invention are believed to primarily provide in synergistic conjunction with the generally decreased reactor chamber pressures the enhanced bulk properties of silicon oxide dielectric layers formed in accord with the method of the present invention. Finally, the generally increased tetraethylorthosilicate (TEOS) concentrations employed within carrier gases employed within the ozone-TEOS thermal chemical vapor deposition (CVD) method of the present invention provide generally increased microelectronics fabrication throughput in comparison with ozone-TEOS thermal chemical vapor deposition (CVD) methods as are more conventional in the art and employ lower tetraethylorthosilicate (TEOS) concentrations within their carrier gas flows.

Second Preferred Embodiment

Figure 3:
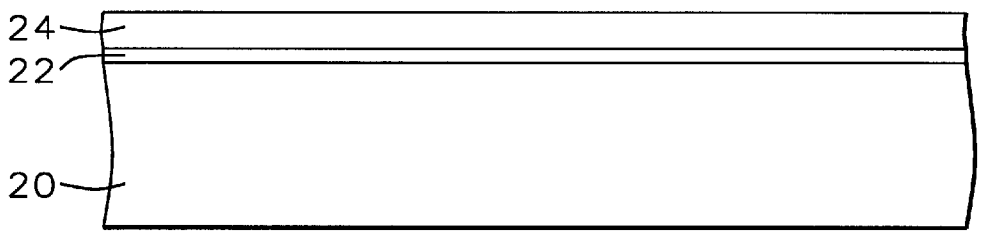
FIG. 3 to FIG. 6 show a series of schematic cross-sectional diagrams illustrating the results of forming in accord with a more specific embodiment of the present invention which comprises a second preferred embodiment of the present invention a shallow trench isolation region within a shallow trench within a silicon semiconductor substrate while employing an ozone-TEOS thermal chemical vapor deposition (CVD) method in accord with the method of the present invention.

Referring now to FIG. 3 to FIG. 6, there is shown a series of schematic cross-sectional diagrams illustrating the results of forming in accord with a more specific embodiment of the present invention which comprises a second preferred embodiment of the present invention a shallow trench isolation region within a shallow trench within a silicon semiconductor substrate employed within an integrated circuit microelectronics fabrication while employing the ozone-TEOS thermal chemical vapor deposition (CVD) method of the present invention. Shown in FIG. 3 is a schematic cross-sectional diagram of the integrated circuit microelectronics fabrication at an early stage in its fabrication in accord with the method of the present invention.

Shown in FIG. 3 is a silicon semiconductor substrate 20 having formed thereupon a blanket thermal silicon oxide pad oxide layer 22 which in turn has formed thereupon a blanket silicon nitride layer 24. Although it is known in the art of integrated circuit microelectronics fabrication that silicon semiconductor substrates may be obtained with either dopant polarity, several dopant concentrations and various crystallographic orientations, for the second preferred embodiment of the present invention, the silicon semiconductor substrate 20 is preferably a (100) silicon semiconductor substrate having an N- or P-doping.

Similarly, with respect to the blanket thermal silicon oxide pad oxide layer 22 employed within the second preferred embodiment of the present invention, the blanket thermal silicon oxide pad oxide layer 22 is preferably formed employing methods and materials analogous or equivalent to the methods and materials employed when forming the thermal silicon oxide dielectric layer 12 within the first preferred embodiment of the present invention as illustrated within the schematic cross-sectional diagram of FIG. 1. In particular, the blanket thermal silicon oxide pad oxide layer 22 is preferably formed employing a thermal oxidation method at a temperature of from about 850 to about 1000 degrees centigrade for a time period of from about 5 to about 20 minutes to form the blanket thermal silicon oxide pad oxide layer 22 of thickness from about 70 to about 150 angstroms upon the silicon semiconductor substrate 20. The thermal oxidation method thermally oxidizes a silicon semiconductor substrate predecessor to the silicon semiconductor substrate 20.

Finally, with respect to the blanket silicon nitride layer 24, the blanket silicon nitride layer 24 is preferably formed employing methods and materials as are conventional in the art of integrated circuit microelectronics fabrication, which will typically, although not exclusively, include chemical vapor deposition (CVD) methods and plasma enhanced chemical vapor deposition (PECVD) methods employing suitable silicon source materials and nitrogen source materials as are similarly conventional in the art of integrated circuit microelectronics fabrication. Preferably, the blanket silicon nitride layer 24 so formed is formed to a thickness of from about 1000 to about 2000 angstroms upon the blanket thermal silicon oxide pad oxide layer 22.

Figure 4:
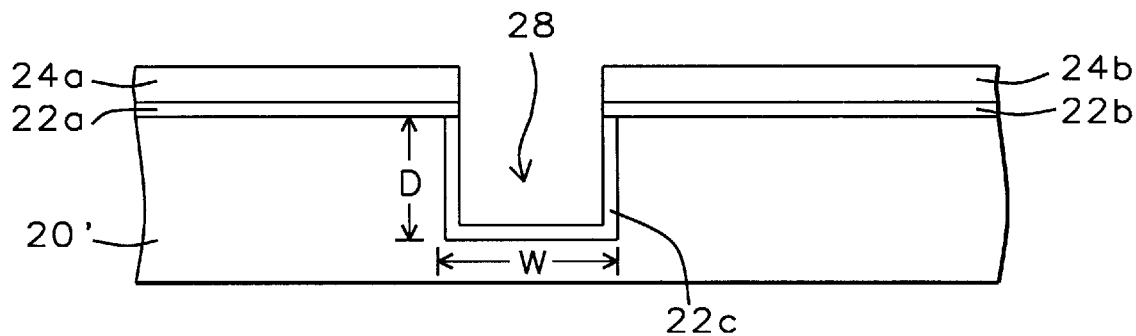

Referring now to FIG. 4, there is shown a schematic cross-sectional diagram illustrating the results of further processing of the integrated circuit microelectronics fabrication whose schematic cross-sectional diagram is illustrated in FIG. 3. Shown in FIG. 4 is a schematic cross-sectional diagram of an integrated circuit microelectronics fabrication otherwise equivalent to the integrated circuit microelectronics fabrication whose schematic cross-sectional diagram is illustrated in FIG. 3, but wherein, in-part, there is formed a trench 28 of depth D and width W within the silicon semiconductor substrate 20 to form therefrom an etched silicon semiconductor substrate while simultaneously forming from the blanket thermal silicon oxide pad oxide layer 22 and the blanket silicon nitride layer 24 a corresponding pair of patterned thermal silicon oxide pad oxide layers 22a and 22b and corresponding pair of patterned silicon nitride layers 24a and 24b. Within the integrated circuit microelectronics fabrication whose schematic cross-sectional diagram is illustrated in FIG. 4, the depth D of the trench is preferably from about 0.3 to about 0.5 microns while the width W of the trench is preferably at least about 0.2 microns. Typically and preferably the trench will have a positive sidewall taper of from about 75 to about 90 degrees.

Within the second preferred embodiment of the present invention, the blanket silicon nitride layer 24, the blanket thermal silicon oxide pad oxide layer 22 and the silicon semiconductor substrate 20 are preferably sequentially etched to form the patterned silicon nitride layers 24 and 24b, the patterned thermal silicon oxide pad oxide layers 22a and 22b, and the etched silicon semiconductor substrate through use of methods as are conventional in the art of integrated circuit microelectronics fabrication. Such methods will typically include, but are not limited to, photolithographic methods followed by plasma etch methods employing suitable etchant gas compositions. Within the second preferred embodiment of the present invention, suitable etchant gas compositions employed within plasma etch methods will typically comprise fluorine containing etchant gas compositions when plasma etching the blanket silicon nitride layer 24 and the blanket thermal oxide pad oxide layer 22, followed by chlorine containing etchant gas compositions when plasma etching the silicon semiconductor substrate 20 to form the etched silicon semiconductor substrate.

Also shown in FIG. 4 is a thermal silicon oxide trench liner layer 22c formed within the trench 28 defined within the etched silicon semiconductor substrate to thus form from the etched silicon semiconductor substrate a thermally oxidized etched silicon semiconductor substrate 20'. Within the second preferred embodiment of the present invention, the thermal silicon oxide trench liner layer 22c is preferably formed through thermal oxidation of the etched silicon semiconductor substrate employing methods and materials analogous or equivalent to the methods and materials employed when thermally oxidizing the predecessor silicon semiconductor substrate to the silicon semiconductor substrate 20 when forming upon silicon semiconductor substrate 20 the blanket thermal silicon oxide pad oxide layer 22. Preferably, the thermal silicon oxide trench liner layer 22c is formed to a thickness of from about 150 to about 350 angstroms upon the thermally oxidized etched silicon semiconductor substrate 20' within the trench 28 formed therein.

Figure 5:
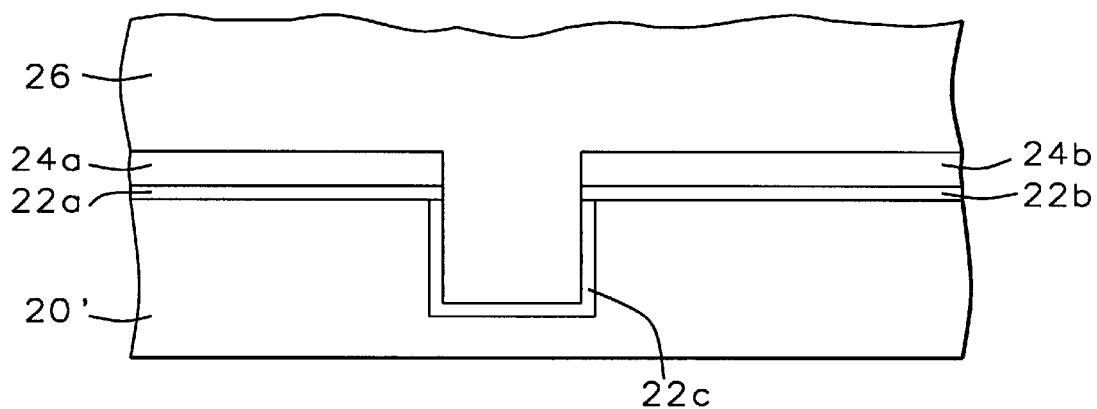

Referring now to FIG. 5, there is shown a schematic cross-sectional diagram illustrating the results of further processing of the integrated circuit microelectronics fabrication whose schematic cross-sectional diagram is illustrated in FIG. 4. Shown in FIG. 5 is a schematic cross-sectional diagram of an integrated circuit microelectronics fabrication otherwise equivalent to the integrated circuit microelectronics fabrication whose schematic cross-sectional diagram is illustrated in FIG. 4, but wherein there is formed over the integrated circuit microelectronics fabrication a blanket second silicon oxide layer 26.

Within the second preferred embodiment of the present invention, the blanket second silicon oxide layer 26 is preferably formed employing an ozone-TEOS thermal chemical vapor deposition (CVD) method employing methods and materials analogous or equivalent to the methods and materials employed when forming the second silicon oxide dielectric layer 14 within the first preferred embodiment of the present invention as illustrated within the schematic cross-sectional diagram of FIG. 2. As is illustrated within the schematic cross-sectional diagram of FIG. 5, the blanket silicon oxide dielectric layer 26 so formed is formed with an attenuated surface sensitivity with respect to the blanket thermal silicon oxide trench liner layer 22c in comparison with the patterned silicon nitride layers 24a and 24b. Preferably, the blanket second silicon oxide layer 26 is formed to a thickness greater that the depth D of the trench, typically from about 5000 to about 7000 angstroms.

Figure 6:
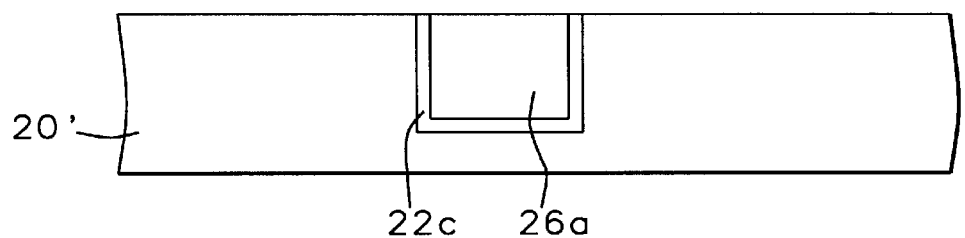

Referring now to FIG. 6, there is shown a schematic cross-sectional diagram illustrating the results of further processing of the integrated circuit microelectronics fabrication whose schematic cross-sectional diagram is illustrated in FIG. 5. Shown in FIG. 6 is a schematic cross-sectional diagram of an integrated circuit microelectronics fabrication otherwise equivalent to the integrated circuit microelectronics fabrication whose schematic cross-sectional diagram is illustrated in FIG. 5, but wherein the blanket second silicon oxide dielectric layer 26, the patterned silicon nitride layers 24a and 24b, and the patterned thermal silicon oxide pad oxide layers 22a and 22b have been planarized while employing the thermally oxidized etched silicon semiconductor substrate 20' as a planarization stop to form the thermally oxidized etched silicon semiconductor substrate 20' having formed therein a trench isolation region 26a separated from the thermally oxidized etched silicon semiconductor substrate 20' by the thermal silicon oxide trench liner layer 22c.

To form the integrated circuit microelectronics fabrication whose schematic cross-sectional diagram is illustrated in FIG. 6 from the integrated circuit microelectronics fabrication whose schematic cross-sectional diagram is illustrated in FIG. 5, there is typically and preferably employed a chemical mechanical polish (CMP) planarizing method as is conventional in the art of integrated circuit microelectronics fabrication. Such a chemical mechanical polish (CMP) planarizing method will typically and preferably employ a silica slurry composition as is similarly conventional in the art of integrated circuit microelectronics fabrication.

Upon forming the integrated circuit microelectronics fabrication whose schematic cross-sectional diagram is illustrated in FIG. 6, there is formed an integrated circuit microelectronics fabrication having formed therein a shallow trench isolation region with enhanced gap filling properties, enhanced bulk properties and attenuated surface sensitivity when forming the shallow trench isolation region upon a thermal silicon oxide trench liner layer.

EXAMPLES

In order to demonstrate the value of the method of the present invention in providing silicon oxide dielectric layers formed employing ozone-TEOS thermal chemical vapor deposition (CVD) methods with enhanced gap filling properties, enhanced bulk properties and attenuated surface sensitivity with respect to a thermally oxidized silicon substrate layer, there was obtained two pair of (100) silicon semiconductor substrates. Upon each semiconductor substrate within the first pair of the (100) silicon semiconductor substrates was formed a thermal silicon oxide dielectric layer through thermal oxidation of each (100) silicon semiconductor substrate at a temperature of about 920 degrees centigrade for a time period of about 30 minutes to form the thermal silicon oxide dielectric layer of thickness about 200 angstroms. Each (100) silicon semiconductor substrate within the second pair of (100) silicon semiconductor substrates was a bare silicon semiconductor substrate which had formed thereupon no thermal silicon oxide dielectric layer.

Upon one semiconductor substrate from each of the first pair of (100) silicon semiconductor substrates and the second pair of (100) silicon semiconductor substrates was formed a silicon oxide dielectric layer employing an ozone-TEOS thermal chemical vapor deposition (CVD) method as is conventional in the art of microelectronics fabrication. The conventional ozone-TEOS thermal chemical vapor deposition (CVD) method also employed: (1) a reactor chamber pressure of about 450 torr; (2) a semiconductor substrate temperature of about 400 degrees centigrade; (3) an ozone concentration of about 13 weight percent in an oxygen carrier gas flow of about 5000 standard cubic centimeters per minute (sccc); and (4) a tetraethylorthosilicate (TEOS) silicon source material concentration of about 475 milligrams per cubic meter in a helium carrier gas flow rate of about 4000 standard cubic centimeters per minute (sccm).

Upon a second semiconductor substrate from each of the first pair of (100) silicon semiconductor substrates and the second pair of (100) silicon semiconductor substrates was formed a silicon oxide dielectric layer employing a second ozone-TEOS thermal chemical vapor deposition (CVD) method in accord with the preferred embodiment of the present invention. The second ozone-TEOS thermal chemical vapor deposition (CVD) method employed: (1) a reactor chamber pressure of about 60 torr; (2) a semiconductor substrate temperature of about 480 degrees centigrade; (3) an ozone oxidant concentration of about 13 weight percent in an oxygen carrier gas flow of about 5000 standard cubic centimeters per minute (sccm); and (4) a tetraethylorthosilicate (TEOS) concentration of about 475 milligrams per cubic meter in a helium carrier gas flow of about 4000 standard cubic centimeters per minute (sccm).

The silicon oxide dielectric layers formed employing the ozone-TEOS thermal chemical vapor deposition (CVD) methods upon the silicon substrates or the thermal silicon oxide dielectric layers were formed for a deposition time period of about 6 minutes. The thicknesses of the silicon oxide dielectric layers formed employing the ozone-TEOS thermal chemical vapor deposition (CVD) methods were then determined employing ellipsometric methods as are conventional in the art of microelectronics fabrication.

Each of the silicon oxide dielectric layers formed employing the ozone-TEOS thermal chemical vapor deposition (CVD) methods was then etched within a 50:1 dilute hydrofluoric acid solution in order to determine the etch rate of each of the silicon oxide dielectric layers formed employing the ozone-TEOS thermal chemical vapor deposition (CVD) methods. The resulting etch rates are also reported within Table I.

TABLE I

| Example | Substrate | Dep Pressure (torr) | Dep Temperature (degrees C.) | Dep Rate (A/min) | Etch Rate (A/min) |
| --- | --- | --- | --- | --- | --- |
| 1 | silicon | 60 | 480 | 1250 | 400 |
| 2 | th oxide | 60 | 480 | 1000 | 420 |
| 3 | silicon | 450 | 400 | 1800 | 330 |
| 4 | th oxide | 450 | 400 | 120 | >1650 |

As is seen from review of the data contained within Table I, silicon oxide dielectric layers formed employing ozone-TEOS thermal chemical vapor deposition (CVD) methods in accord with the preferred embodiment of the present invention provide silicon oxide dielectric layer exhibiting: (1) attenuated etch rates with dilute hydrofluoric acid solution, which implies enhanced bulk properties, such as but not limited to decreased shrinkage which in turn implies enhanced gap filling properties; and (2) attenuated surface sensitivity with respect to thermal oxidized silicon substrate layers.

As is understood by a person skilled in the art, the preferred embodiments and examples of the present invention are illustrative of the present invention rather than limiting of the present invention. Revisions and modifications may be made to methods, materials, structures and dimensions which are employed for forming silicon oxide dielectric layers in accord with the preferred embodiments or examples of the present invention while still forming silicon oxide dielectric layers in accord with the present invention, as defined by the appended claims.

What is claimed is:

1. A method for forming a silicon oxide dielectric layer comprising:

providing a silicon substrate layer employed within a microelectronics fabrication;

forming employing the silicon substrate layer a thermal silicon oxide layer through thermal oxidation of the silicon substrate layer; and forming upon the thermal silicon oxide layer a second silicon oxide layer formed through use of a thermal chemical vapor deposition (CVD) method employing ozone as an oxidant and tetraethylorthosilicate (TEOS) as a silicon source material, the thermal chemical vapor deposition (CVD) method also employing a reactor chamber pressure of from about 40 to about 80 torr, to form with an attenuated surface sensitivity with respect to the thermal silicon oxide layer the second silicon oxide layer upon the thermal silicon oxide layer.

2. The method of claim 1 wherein the microelectronics fabrication is selected from the group consisting of integrated circuit microelectronics fabrications, solar cell microelectronics fabrications, ceramic substrate microelectronics fabrications and flat panel display microelectronics fabrications.

3. The method of claim 1 wherein the thermal silicon oxide layer is formed through thermal oxidation of the silicon substrate layer at a temperature of from about 850 to about 1000 degrees centigrade for a time period of from about 20 to about 40 minutes to form the thermal silicon oxide layer of thickness about 150 to about 350 angstroms.

4. The method of claim 1 wherein the second silicon oxide layer is formed to a thickness of from about 5000 to about 7000 angstroms.

5. The method of claim 1 wherein the thermal chemical vapor deposition (CVD) method simultaneously employs a substrate temperature of from about 460 to about 500 degrees centigrade.

6. A method for forming a trench isolation region comprising:

providing a silicon semiconductor substrate;

forming within the silicon semiconductor substrate a trench;

forming within the trench within the semiconductor substrate a thermal silicon oxide trench liner layer through thermal oxidation of the silicon semiconductor substrate;

forming upon the thermal silicon oxide trench liner layer a second silicon oxide layer formed through use of a thermal chemical vapor deposition (CVD) method employing ozone as an oxidant and tetraethylorthosilicate (TEOS) as a silicon source material, the thermal chemical vapor deposition (CVD) method also employing a reactor chamber pressure of from about 40 to about 80 torr, to form with an attentuated surface sensitivity with respect to the thermal silicon oxide trench liner layer the second silicon oxide layer upon the thermal silicon oxide trench liner layer, where the second silicon oxide layer is formed to a thickness greater than a depth of the trench; and planarizing the second silicon oxide layer to form a trench isolation region upon the thermal silicon oxide trench liner layer within the trench,.

7. The method of claim 6 wherein the thermal oxide trench liner layer is formed through thermal oxidation of the silicon semiconductor substrate at a temperature of from about 850 to about 1000 degrees centigrade for a time period of from about 20 to about 40 minutes to form the thermal silicon oxide trench liner layer of thickness about 150 to about 350 angstrom.

8. The method of claim 6 wherein the second silicon oxide layer is formed to a thickness of form about 5000 to about 7000 angstrom and the trench is formed to a depth of from about 3000 to about 5000 angstrom.

* * * * *